(12) United States Patent
Liu et al.

(10) Patent No.: US 12,426,171 B2
(45) Date of Patent: Sep. 23, 2025

(54) DISPLAY DEVICE

(71) Applicants: Beijing BOE Technology Development Co., Ltd., Beijing (CN); BOE Technology Group Co., Ltd., Beijing (CN)

(72) Inventors: Xiaotong Liu, Beijing (CN); Yuju Chen, Beijing (CN); Yongchun Tao, Beijing (CN); Hui Hua, Beijing (CN); Zhiming Yang, Beijing (CN); Jijing Huang, Beijing (CN); Hengfei Zhang, Beijing (CN); Yingzi Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/579,942

(22) PCT Filed: Jul. 1, 2022

(86) PCT No.: PCT/CN2022/103398
§ 371 (c)(1),
(2) Date: Jan. 17, 2024

(87) PCT Pub. No.: WO2023/000959
PCT Pub. Date: Jan. 26, 2023

(65) Prior Publication Data
US 2024/0244768 A1    Jul. 18, 2024

(30) Foreign Application Priority Data
Jul. 20, 2021    (CN) .......................... 202110818073.1

(51) Int. Cl.
*H05K 5/00* (2025.01)
*G06F 1/16* (2006.01)
(Continued)

(52) U.S. Cl.
CPC ......... *H05K 5/0018* (2022.08); *G06F 1/1637* (2013.01); *G06F 1/1643* (2013.01);
(Continued)

(58) Field of Classification Search
CPC ...... H05K 5/0018; H05K 5/02; G06F 1/1637; G06F 1/1643; G06F 1/1656; G06F 3/016;
(Continued)

(56) References Cited

U.S. PATENT DOCUMENTS

2010/0053854 A1   3/2010   Nishikawa et al.
2011/0187960 A1   8/2011   Kobayashi et al.
(Continued)

FOREIGN PATENT DOCUMENTS

CN    101794038 A    8/2010
CN    104679241 A    6/2015
(Continued)

OTHER PUBLICATIONS

International Search Report, mailed Aug. 25, 2022, from PCT International Application No. PCT/CN2022/103398, 4 pages.
(Continued)

*Primary Examiner* — Tom V Sheng
(74) *Attorney, Agent, or Firm* — Workman Nydegger (57) ABSTRACT

A display device is disclosed. The display device includes a module outer frame, including a display opening window, where an accommodation space is formed inside the module outer frame; a display module, fixed in the accommodating space, where a light emitting side of the display module faces the display opening window; a touch module, fixed between the display module and the display opening win-
(Continued)

dow, where the touch module includes a haptic sensor configured to generate a standing wave on a surface of the touch module during operation; a first isolation structure, arranged between the touch module and the module outer frame, where the first isolation structure is configured to isolate the touch module from the module outer frame; and a second isolation structure, arranged between the display module and the touch module, where the second isolation structure is configured to isolate the display module from the touch module.

19 Claims, 10 Drawing Sheets

(51) Int. Cl.
*G06F 3/01* (2006.01)
*H05K 5/02* (2006.01)
*G06F 3/041* (2006.01)
*G06F 3/044* (2006.01)
*G09F 13/04* (2006.01)

(52) U.S. Cl.
CPC ............ *G06F 1/1656* (2013.01); *G06F 3/016* (2013.01); *H05K 5/02* (2013.01); *G06F 3/0412* (2013.01); *G06F 3/044* (2013.01); *G06F 2203/04107* (2013.01); *G09F 13/0413* (2013.01); *G09G 2300/04* (2013.01)

(58) Field of Classification Search
CPC .................. G06F 3/044; G06F 3/0412; G06F 2203/04107; G09F 13/0413; G09G 2300/04
USPC ......................................................... 345/173
See application file for complete search history.

(56) References Cited

U.S. PATENT DOCUMENTS

| | | | |
|---|---|---|---|
| 2013/0095885 A1* | 4/2013 | Liu | H04M 1/22 455/556.1 |
| 2013/0222319 A1* | 8/2013 | Tsurusaki | G06F 1/1626 345/173 |
| 2013/0335377 A1* | 12/2013 | Lin | G06F 1/1616 345/173 |
| 2014/0347322 A1 | 11/2014 | Kamata et al. | |
| 2014/0362306 A1* | 12/2014 | Chen | G06F 3/0412 349/12 |
| 2015/0009176 A1* | 1/2015 | Inata | G06F 1/1626 345/174 |
| 2015/0160760 A1* | 6/2015 | Sato | G06F 1/1626 345/174 |
| 2015/0212579 A1* | 7/2015 | Nakamura | G06F 3/0446 345/173 |
| 2015/0227200 A1* | 8/2015 | Norieda | G06F 3/041 345/173 |
| 2016/0154462 A1 | 6/2016 | Haga et al. | |
| 2016/0342000 A1 | 11/2016 | Tamura | |
| 2018/0284893 A1* | 10/2018 | Shimizu | G06F 1/1643 |
| 2019/0339780 A1* | 11/2019 | Nagasaki | G06F 3/041 |
| 2020/0081541 A1* | 3/2020 | Myung | G06F 3/0416 |
| 2020/0142489 A1* | 5/2020 | Nakamura | G06F 1/1637 |
| 2022/0357797 A1* | 11/2022 | Funakawa | H04N 1/00392 |

FOREIGN PATENT DOCUMENTS

| | | |
|---|---|---|
| CN | 105654851 A | 6/2016 |
| JP | 2012027765 A | 2/2012 |
| JP | 2012173892 A | 9/2012 |
| JP | 2018124792 A | 8/2018 |
| WO | 2010033419 A2 | 3/2010 |
| WO | 2020241513 A1 | 12/2020 |

OTHER PUBLICATIONS

Extended European Search Report, mailed Sep. 11, 2024, for European Patent App. No. 22845124.1, 9 pages.

* cited by examiner

DISPLAY DEVICE

CROSS REFERENCE TO RELATED APPLICATIONS

This application is a US National Stage of International Application No. PCT/CN2022/103398, filed on Jul. 1, 2022, which claims priority to Chinese Patent Application No. 202110818073.1, filed with the China National Intellectual Property Administration on Jul. 20, 2021, and entitled "Display Device", the entire content of which is incorporated herein by reference.

TECHNICAL FIELD

The present disclosure relates to the technical field of display, and in particular to a display device.

BACKGROUND

Haptic feedback is the focus of today's technology development, and the haptic feedback can enable a terminal to interact with the human body through the sense of touch. The haptic feedback may be divided into two categories: one is vibration feedback, and the other is haptic reproduction technology.

The surface haptic reproduction technology can perceive characteristics of objects through touch of a screen by a bare finger, realize efficient and natural interaction on multimedia terminals, has great research value, and thus has been widely concerned by domestic and foreign researchers. In the physical sense, the surface haptic sense is the effect of the surface roughness of the object on the surface of the skin (fingertip), and different friction forces are formed due to different surface structures. Therefore, different haptic/tactile simulations may be realized by controlling the surface friction forces.

SUMMARY

Embodiments of the present disclosure provide a display device, including:
- a module outer frame, including a display opening window, where an accommodation space is formed inside the module outer frame;
- a display module, fixed in the accommodating space, where a light emitting side of the display module faces the display opening window;
- a touch module, fixed between the display module and the display opening window, where the touch module includes a haptic sensor, and the haptic sensor is configured to generate a standing wave on a surface of the touch module during operation;
- a first isolation structure, arranged between the touch module and the module outer frame, where the first isolation structure is configured to isolate the touch module from the module outer frame; and
- a second isolation structure, arranged between the display module and the touch module, where the second isolation structure is configured to isolate the display module from the touch module.

In some embodiments, in the display device provided in an embodiment of the present disclosure, a Young's modulus of each of the first isolation structure and the second isolation structure is less than 0.1 MPa.

In some embodiments, in the display device provided in an embodiment of the present disclosure, a material of the first isolation structure is polydimethylsiloxane, PDMS, foam or rubber; and
a material of the second isolation structure is PDMS, foam or rubber.

In some embodiments, in the display device provided in an embodiment of the present disclosure, the second isolation structure is located at positions of two opposite edge frames of the display module.

In some embodiments, in the display device provided in an embodiment of the present disclosure, the second isolation structure located at one of the positions of the two opposite edge frames includes a plurality of second isolation parts arranged at intervals.

In some embodiments, in the display device provided in an embodiment of the present disclosure, an extension direction of each of the two opposite edge frames where the second isolation structure is located is perpendicular to a vibration propagation direction of the standing wave.

In some embodiments, in the display device provided in an embodiment of the present disclosure, the two opposite edge frames where the second isolation structure is located are short edge frames.

In some embodiments, in the display device provided in an embodiment of the present disclosure, the second isolation structure is fixed on a surface of the display module facing the touch module.

In some embodiments, in the display device provided in an embodiment of the present disclosure, the module outer frame includes a module side frame and a module bottom frame, and the display opening window is located at a side facing away from the module bottom frame; and
the second isolation structure is further fixed on a side of the display module facing the module side frame.

In some embodiments, in the display device provided in an embodiment of the present disclosure, the first isolation structure is located at positions of two opposite edge frames of the touch module; and the first isolation structure and the second isolation structure are arranged at edge frames on same sides.

In some embodiments, in the display device provided in an embodiment of the present disclosure, the first isolation structure located at one of the positions of the two opposite edge frames includes a plurality of first isolation parts arranged at intervals.

In some embodiments, in the display device provided in an embodiment of the present disclosure, the module outer frame includes a module side frame, a module bottom frame, and a module top frame, and the module top frame includes the display opening window; and
the first isolation structure is fixed on a surface of the touch module facing the module top frame.

In some embodiments, in the display device provided in an embodiment of the present disclosure, the first isolation structure and the second isolation structure are covered by the module top frame, and the first isolation structure and the second isolation structure do not overlap with the display opening window.

In some embodiments, in the display device provided in an embodiment of the present disclosure, the haptic sensor is covered by the module top frame, and the haptic sensor does not overlap with the display opening window.

In some embodiments, in the display device provided in an embodiment of the present disclosure, the haptic sensor, the first isolation structure, and the second isolation structure are located at positions of two opposite short edge frames;

a relationship between a width L2 of the haptic sensor at one short edge frame and a distance L1 between the haptic sensor and an edge of the short edge frame satisfies:

$$0 < L1 \leq L/n;$$
$$0 < L2 \leq L/n;$$

where n is a positive integer, and L is a length of the touch module.

In some embodiments, in the display device provided in an embodiment of the present disclosure, the first isolation structure is further fixed on a side of the touch module facing the module side frame.

In some embodiments, in the display device provided in an embodiment of the present disclosure, the display device further includes: a limiting structure, arranged on a side of the module top frame facing the module bottom frame;

where the limiting structure is configured to limit a position of the touch module; and the first isolation structure is further fixed between the touch module and the limiting structure.

In some embodiments, in the display device provided in an embodiment of the present disclosure, the module outer frame includes a fixing component within the accommodating space, the fixing component is configured to fix the display module and the touch module; and the first isolation structure is arranged between the fixing component and the touch module.

In some embodiments, in the display device provided in an embodiment of the present disclosure, the module outer frame includes a module side frame and a module bottom frame, and the display opening window is located at a side facing away from the module bottom frame; and the first isolation structure is arranged between the touch module and the module side frame.

In some embodiments, in the display device provided in an embodiment of the present disclosure, the first isolation structure is arranged to surround the touch module.

In some embodiments, in the display device provided in an embodiment of the present disclosure, the haptic sensor and the second isolation structure are located at positions of two opposite short edge frames; and the touch module includes a light-blocking layer configured to block the haptic sensor and the second isolation structure.

DETAILED DESCRIPTION

Figure 1:
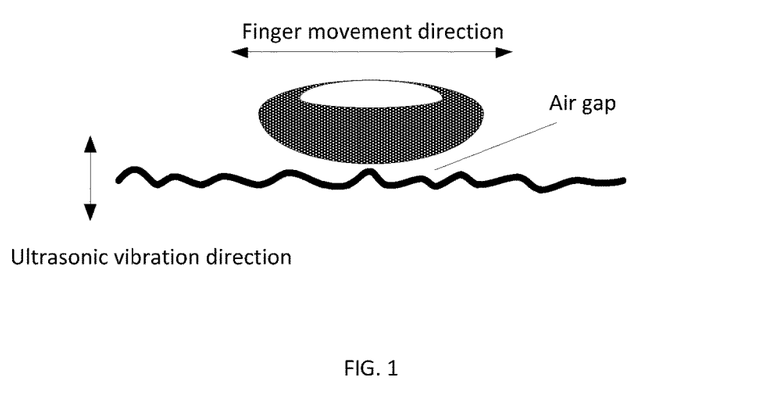
FIG. 1 is a schematic diagram of the principle for achieving haptic reproduction.

Ultrasonic haptic reproduction device uses piezoelectric elements to resonate and form standing waves, forming a pressure film effect. This structure only requires a planar body (such as glass or metal plate), and a corresponding piezoelectric ceramic body or ceramic film is arranged on the planar body to achieve haptic reproduction effect on the plane. The working principle of the haptic reproduction device of the pressure film effect is to stick a piezoelectric material on a substrate and apply a high-frequency alternating excitation source. Due to the inverse piezoelectric effect, the piezoelectric material undergoes stretching deformation, which drives the substrate to vibrate and generate specific vibration modes. When an operator touches a panel with his/her finger, as shown in FIG. 1, an air gap between the finger and the panel may continuously lift the finger, causing incomplete contact between the finger and the a surface of the substrate, reducing the friction force on the surface of the substrate. By applying a certain waveform, control on the friction on the surface of the substrate may be achieved, thereby achieving haptic perception effect. However, based on the principle, four sides of the substrate cannot be completely fixed. Because when the substrate is completely fixed, the vibration amplitude of the substrate will be greatly reduced, and the haptic sensation will be significantly reduced. If the substrate is not fixed, a contact surface between a vibrating substrate and a module will generate some noise, which affects the haptic experience.

For making objectives, technical solutions and advantages of embodiments of the present disclosure clearer, technical solutions of embodiments of the present disclosure will be clearly and completely described below in conjunction with accompanying drawings in embodiments of the present disclosure. Apparently, embodiments described are some rather than all of embodiments of the present disclosure. Embodiments in the present disclosure and features of embodiments may be combined with each other without conflict. Based on embodiments of the present disclosure, all other embodiments obtained by those of ordinary skill in the art without making creative efforts fall within the scope of protection of the present disclosure.

Unless otherwise defined, technical or scientific terms used in the present disclosure should have ordinary meanings as understood by those of ordinary skill in the art to which the present disclosure belongs. "Including", "comprising", and other similar words used in the present disclosure indicate that elements or objects before the word include elements or objects after the word and their equivalents, without excluding other elements or objects.

It should be noted that a size and a shape of each figure in the drawings do not reflect a true scale, but only for illustrating the present disclosure. Throughout the drawings, identical or similar reference numerals denote identical or similar elements or elements having identical or similar functions.

Figure 2:
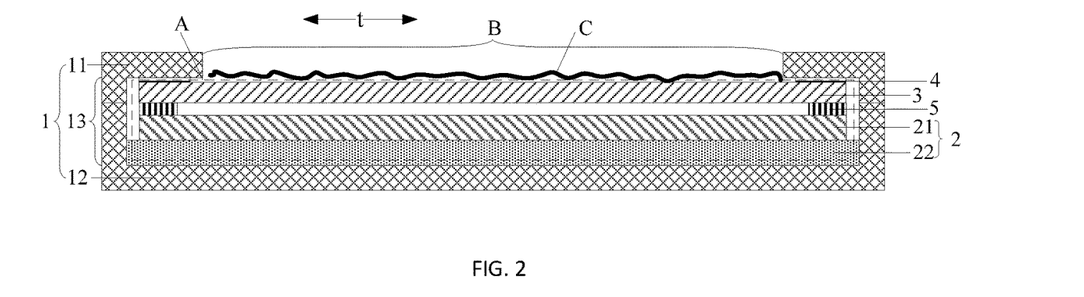
FIG. 2 is a schematic structural diagram of a display device provided in an embodiment of the present disclosure.

FIG. 2 is a schematic structural diagram of a display device provided in an embodiment of the present disclosure. Embodiment of the present disclosure provides a display device, as shown in FIG. 2, including:
- a module outer frame 1, including a display opening window B, where an accommodation space A is formed inside the module outer frame 1;
- a display module 2, fixed in the accommodating space A, where a light emitting side of the display module 2 faces the display opening window B;
- a touch module 3, fixed between the display module 2 and the display opening window B, where the touch module 3 includes a haptic sensor 31 (refer to FIGS. 3A to 3D), and the haptic sensor 31 is configured to generate a standing wave C on a surface of the touch module 3 during operation;
- a first isolation structure 4, arranged between the touch module 3 and the module outer frame 1, where the first isolation structure 4 is configured to isolate the touch module 3 from the module outer frame 1; and
- a second isolation structure 5, arranged between the display module 2 and the touch module 3, where the second isolation structure 5 is configured to isolate the display module 2 from the touch module 3.

In the display device provided by embodiments of the present disclosure, in order to avoid high-frequency noise caused by friction between the display module 2 and the module outer frame 1 when the touch module 3 vibrates, the first isolation structure 4 is used to isolate the touch module 3 and the module outer frame 1, maintain a certain distance between the touch module 3 and the module outer frame 1; and the second isolation structure 5 is used to isolate the display module 2 and the touch module 3, maintain a certain distance between the display module 2 and the touch module 3, avoiding high-frequency noise and heat generated by the friction between the touch module 3 and the display module 2 and the friction between the touch module 3 and the module outer frame 1, which affects the user experience. Moreover, the first isolation structure 4 and the second isolation structure 5 are not completely fixed to the touch module 3, so the first isolation structure 4 and the second isolation structure 5 will not significantly suppress the vibration of the touch module 3 during the operation of the haptic sensor 31. That is, the intensity of the haptic perception may be effectively ensured without reducing the vibration amplitude of the touch module 3.

In some embodiments, to ensure that the added isolation structures do not suppress the vibration of the touch module 3, the first isolation structure 4 and the second isolation structure 5 should choose materials with lower Young's modulus, such as materials with Young's modulus less than 0.1 MPa.

In some embodiments, the material of the first isolation structure 4 may be selected from polydimethylsiloxane PDMS, foam or rubber, etc. Similarly, the material of the second isolation structure 5 may be selected as PDMS, foam, or rubber. Moreover, the first isolation structure 4 and the second isolation structure 5 can choose the same material or different materials, which is not limited here.

In some embodiments, the display module 2 can include a display screen 21 and another component 22, and the another component 22 is arranged at a side facing away from a light emitting side of the display screen 21. In some embodiments, the display screen 21 may be a liquid crystal display screen, the corresponding another component 22 may be a backlight module, etc. The display screen 21 may also be an organic light emitting display screen, and the corresponding another component 22 may be a heat dissipation module, etc. The specific structure of the display module 2 is not limited here.

Figure 3A:
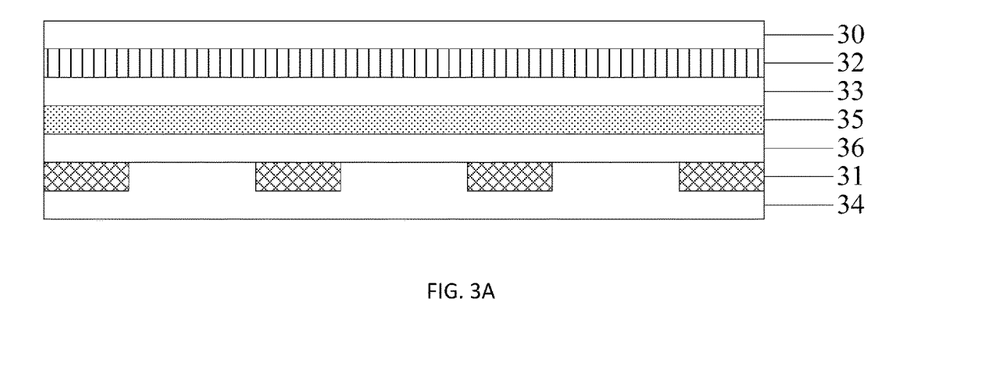
FIG. 3A is a schematic structural diagram of a touch module in a display device provided in an embodiment of the present disclosure.
Figure 3B:
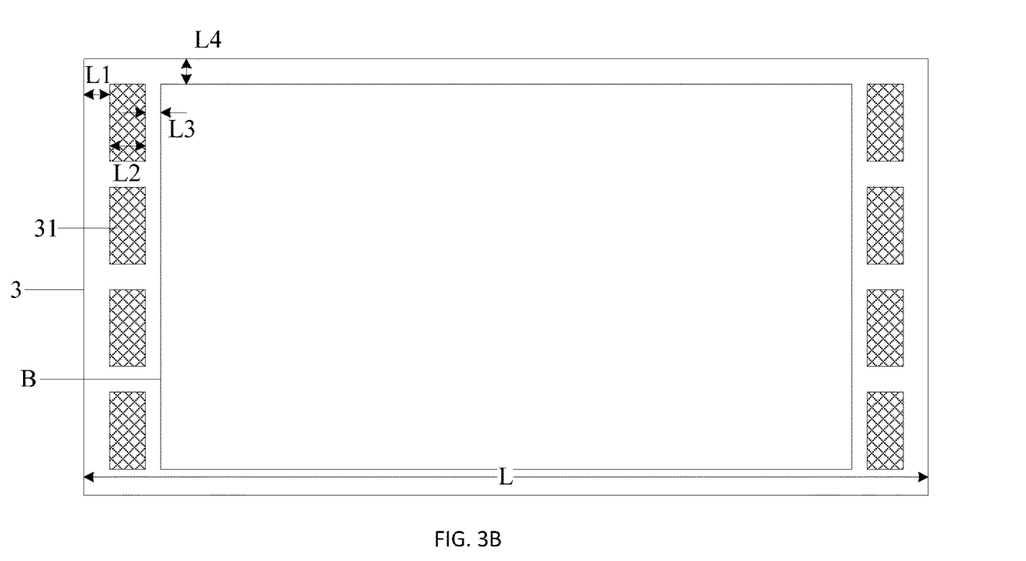
FIG. 3B is a top view schematic diagram of a touch module in a display device provided in an embodiment of the present disclosure.
Figure 3C:
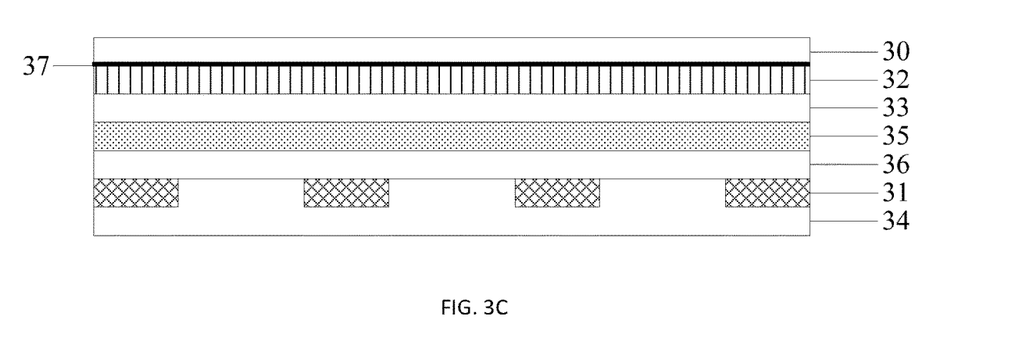
FIG. 3C is another schematic structural diagram of a touch module in a display device provided in an embodiment of the present disclosure.
Figure 3D:
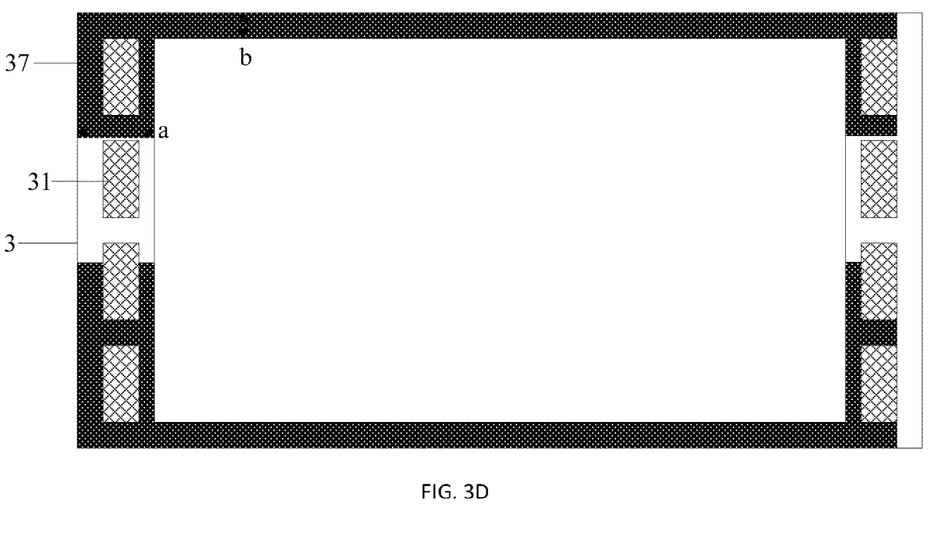
FIG. 3D is another top view schematic diagram of a touch module in a display device provided in an embodiment of the present disclosure.

FIGS. 3A and 3C respectively show schematic structural diagrams of a touch module in a display device provided in embodiments of the present disclosure; FIGS. 3B and 3D are top view schematic diagrams of a touch module in a display device provided in embodiments of the present disclosure. In some embodiments, as shown in FIG. 3A, the touch module 3 may include a substrate 30, a touch structure 32, a first insulation layer 33, a haptic sensor 31, and a flat layer 34 (or the flat layer 34 may not be set), where the touch structure 32, the first insulation layer 33, the haptic sensor 31, and the flat layer 34 are sequentially arranged on a side of the substrate 30 facing the display module 2 in stack.

In some embodiments, the touch structure 32 may adopt a single-layer or multi-layer structure. The touch structure 32 may adopt a capacitive touch structure, composed of patterned ITO or nano metal wiring. The specific composition of the touch structure 32 is not limited here. The first insulation layer 33 is configured to protect the touch structure 32, and the first insulation layer 33 may be formed by an inorganic material, such as $SiN_x$ or $SiO_2$, or an organic material, such as PI.

In some embodiments, as shown in FIG. 3A, the touch module 3 includes a shielding conductive layer 35 arranged between the first insulation layer 33 and the haptic sensor 31, and a second insulation layer 36 arranged between the shielding conductive layer 35 and the haptic sensor 31. The shielding conductive layer 35 may be an ITO covering layer of an entire surface. The shielding conductive layer 35 is configured to isolate piezoelectric vibration signals and touch screen signals, avoiding cross talk. The shielding conductive layer 35 is generally connected to the system grounding (GND) signal. The second insulation layer 36 is configured to protect the shielding conductive layer 35, and the second insulation layer 36 may be formed by an inorganic material, such as SiNx or $SiO_2$, or an organic material, such as PI.

In some embodiments, when haptic sensor 31 operates, a standing wave is generated on a surface of the touch module 3 facing away from the display module 2. The standing wave vibrates along the x-axis or y-axis parallel to the surface of touch module 3, and has certain amplitude in a direction perpendicular to the surface of the touch module 3. In order to avoid collision noise caused by vibration between two opposite surfaces of the touch module 3 and the display module 2 during the operation of haptic sensor 31, a gap between the touch module 3 and the display module 2 should be greater than the amplitude of the standing wave. Generally, the maximum amplitude generated by the standing wave is within 2 um, so the gap between the touch module 3 and the display module 2 generally needs to be greater than 2 um.

The structure of the display device provided by embodiments of the present disclosure will be introduced in detail through embodiments as shown below.

Embodiment 1 is as follows.

In some embodiments, as shown in FIG. 2, the module outer frame 1 includes a module side frame 13, a module bottom frame 12, and a module top frame 11, and the module top frame 11 includes a display opening window B. The module top frame 11, module bottom frame 12, and module side frame 13 form an accommodating space A, and the display module 2, the touch module 3, the first isolation structure 4, and the second isolation structure 5 are all arranged in the accommodating space A. The module side frame 13 can form an integral structure with the module bottom frame 12; the module side frame 13 can form an integral structure with the module top frame 11; or, as shown in FIG. 2, a part of the module side frame 13 form an integral structure with the module bottom frame 12, and another part of the module side frame 13 form an integral structure with the module top frame 11, which is not limited here. When assembling the display device, the display module 2, the second isolation structure 5, the touch module 3, and the first isolation structure 4 may be sequentially assembled on the module bottom frame 12, and finally the module top frame 11 may be installed to form a complete display device.

Figure 4:
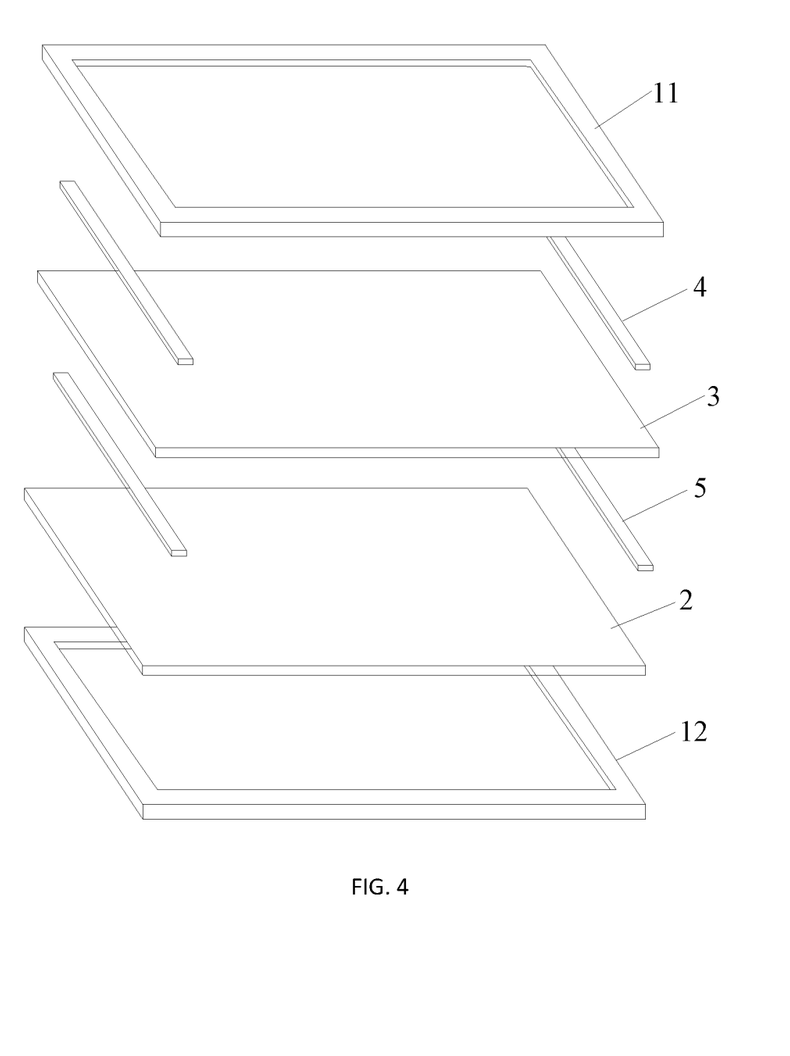
FIG. 4 is an exploded view of a display device provided in an embodiment of the present disclosure.
Figure 5:
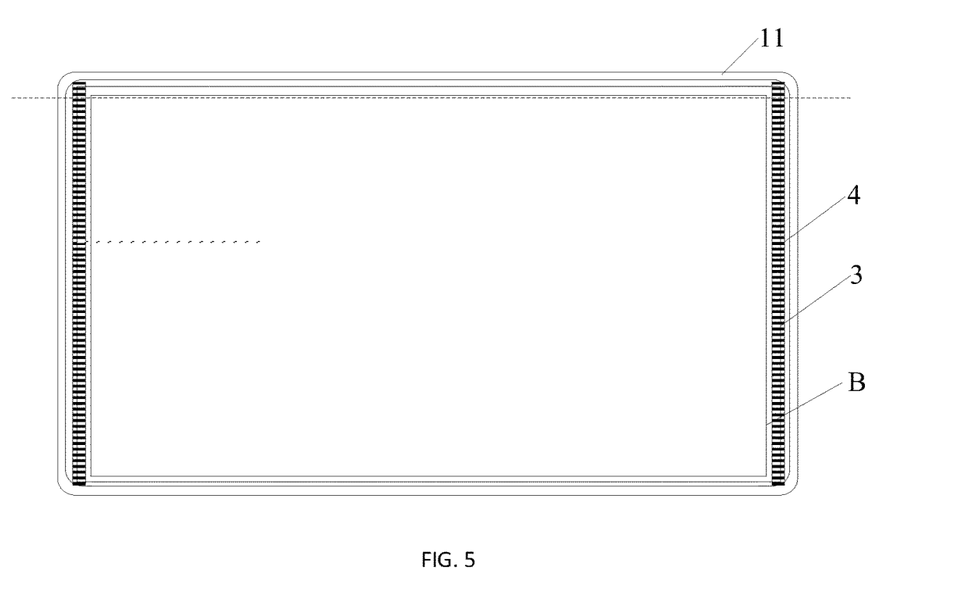
FIG. 5 is a schematic diagram of an upward view structure of a display device provided in an embodiment of the present disclosure.

In some embodiments, in order to ensure that the vibration amplitude of the touch module 3 is not reduced and the intensity of the haptic perception is effectively ensured, the first isolation structure 4 and the second isolation structure 5 only contact with a portion of the frame of the touch module 3, that is, the first isolation structure 4 and the second isolation structure 5 are not completely fixed with the touch module 3. FIG. 4 is an exploded view corresponding to the display device structure shown in FIG. 2, and FIG. 5 is an upward view of the display device structure viewed from one side of the module bottom frame shown in FIG. 2, and only part of the components of the display device are shown. FIG. 2 may be considered as a cross-sectional view of the dashed line in FIG. 5. As shown in FIGS. 4 and 5, the first isolation structure 4 may be located at positions of two opposite edge frames of the touch module 3, and the second isolation structure 5 may be located at positions of two opposite edge frames of the display module 2. Moreover, the first isolation structure 4 and the second isolation structure 5 are generally arranged at positions of edge frames on same sides.

In some embodiments, as shown in FIG. 2, an extension direction of each of the two opposite edge frames where the first isolation structure 4 and the second isolation structure 5 are located is perpendicular to a vibration propagation direction t of the standing wave C.

In some embodiments, as shown in FIG. 4, in order to avoid reducing the vibration amplitude of the touch module 3 as much as possible, the two frames where the first isolation structure 4 and the second isolation structure 5 are located may be short edge frames, that is, there is no isolation structure fixed with the touch module 3 at long edge frames.

In some embodiments, due to that the haptic sensor 31 is opaque, the haptic sensor 31 should be covered by the module top frame 11 and not overlapped with the display opening window B in order to avoid impact of the haptic sensor 31 on display. The haptic sensor 31, the first isolation structure 4, and the second isolation structure 5 may be simultaneously located at positions of two opposite short edge frames. As shown in FIG. 3B, a relationship between a width L2 of the haptic sensor 31 at one short edge frame and a distance L1 between the haptic sensor 31 and an edge of the short edge frame satisfies: $0<L1 \leq L/n$; and $0<L2 \leq L/n$; where n is a positive integer, a value of n may be $5 \leq n \leq 100$, and L is a length of the touch module, a value of L may be 50 mm $\leq L \leq$ 500 mm, and a value of L2 may be about twice the value of L1. Moreover, a distance L3 between the haptic sensor 31 and the display opening window B is larger than or equal to 0, and a distance L4 between the haptic sensor 31 and an edge of the long edge frame is larger than or equal to 0. In the module top frame 11, a distance M between the display opening window B and the edge of the short edge frame is larger than or equal to a sum of L1, L2 and L3. In the module top frame 11, a distance N between the display opening window B and the edge of the long edge frame is larger than or equal to 0.

In some embodiments, as shown in FIG. 2, a size of display opening window B is generally smaller than a size of touch module 3 and a size of display module 2. In order not to affect the display, the first isolation structure 4 and the second isolation structure 5 are covered by the module top frame 11, and an orthogonal projection of the first isolation structure 4 and an orthogonal projection of the second isolation structure 5 on the module bottom frame 12 do not overlap with the display opening window B. In order to avoid high-frequency noise caused by friction between the touch module 3 and the module top frame 11 during vibration, the first isolation structure 4 may be fixed on a surface of the touch module 3 facing the module top frame 11. That is, the first isolation structure 4 is arranged in a peripheral area of the display opening window B to isolate the touch module 3 and the module top frame 11 without affecting the display. An edge of the first isolation structure 4 on a surface of the touch module 3 facing the module top frame 11 may extend beyond the touch module 3, or may be within a range of the touch module 3, which is not limited here. A shape of the first isolation structure 4 may be roughly a strip.

Figure 6:
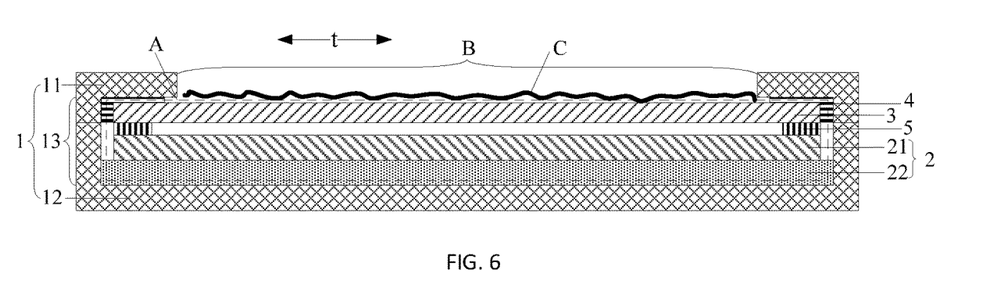
FIG. 6 is another schematic structural diagram of a display device provided in an embodiment of the present disclosure.
Figure 8:
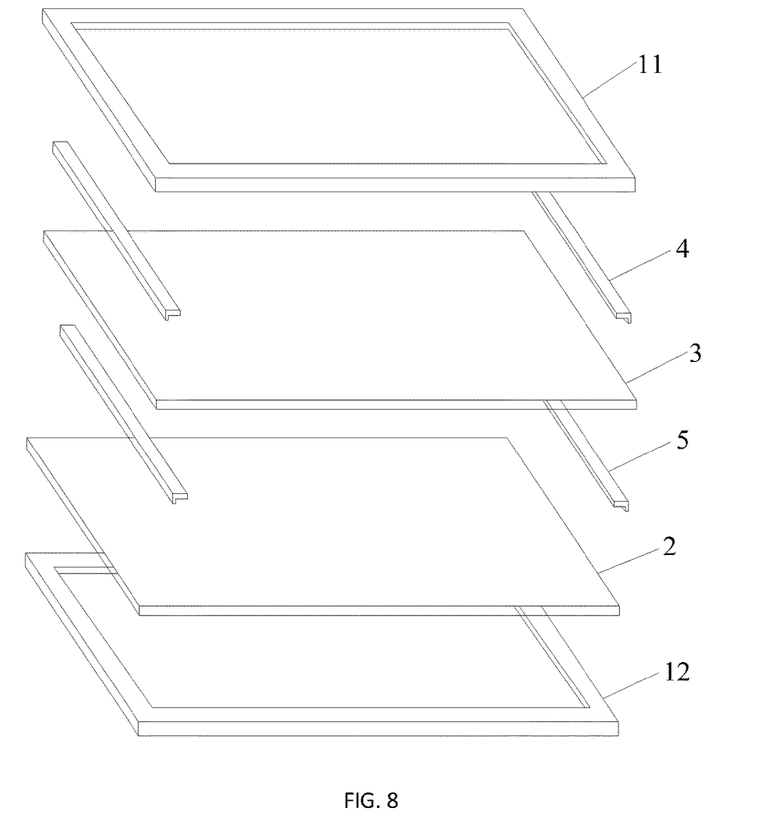
FIG. 8 is another exploded view of a display device provided in an embodiment of the present disclosure.

FIG. 6 is another schematic structural diagram of a display device provided in an embodiment of the present disclosure. In some embodiments, there is generally a certain assembly gap between an edge of touch module 3 and the module side frame 13, in order to avoid high-frequency noise caused by friction between touch module 3 and the module side frame 13 during vibration, as shown in FIG. 6, the first isolation structure 4 may be fixed on a side face of the touch module 3 facing the module side frame 13, that is, the first isolation structure 4 extends from a surface of the touch module 3 facing the module top frame 11 to the side face of the touch module 3 after bending. Moreover, in the present disclosure, there is no clear limit on the length of the portion of the first isolation structure 4 extending to the side face of the touch module 3. The length of the portion of the first isolation structure 4 extending to the side face of the touch module 3 may be approximately same as a thickness of the touch module 3. As shown in FIG. 8, a cross-sectional shape of the first isolation structure 4 may be roughly an L-shaped strip.

In some embodiments, in order to avoid high-frequency noise caused by friction between the touch module 3 and the display module 2 during vibration, and considering that the assembly sequence of each component in the display device is to stack the touch module 3 on the display module 2, as shown in FIGS. 2 and 6, the second isolation structure 5 may be fixed on the surface of display module 2 facing touch module 3. For example, in order not to affect normal display, the second isolation structure 5 may be fixed at edge frames of a non-display area on both sides of a display surface of the display module 2. An edge of the second isolation structure 5 on a surface of the display module 2 facing the touch module 3 may extend beyond the display module 2, or may be within a range of the display module 2, which is not limited here. As shown in FIG. 4, a shape of the second isolation structure 5 may be roughly a strip.

Figure 7:
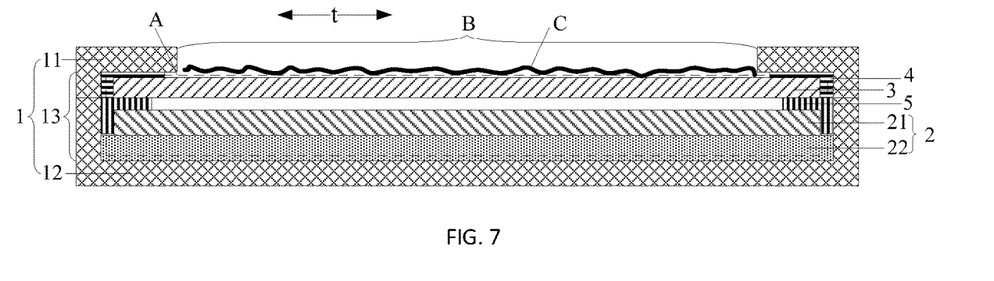
FIG. 7 is another schematic structural diagram of a display device provided in an embodiment of the present disclosure.

FIG. 7 is another schematic structural diagram of a display device provided in an embodiment of the present disclosure. FIG. 8 is an exploded view corresponding to the display device structure shown in FIG. 7. In some embodiments, there is generally a certain assembly gap between an edge of display module 2 and the module side frame 13. As shown in FIG. 7, the second isolation structure 5 may be fixed on a side face of the display module 2 facing the module side frame 13, that is, the second isolation structure 5 extends from a surface of the display module 2 facing the touch module 3 to the side face of the display module 2 after bending. Moreover, in the present disclosure, there is no clear limit on the length of the portion of the second isolation structure 5 extending to the side face of the display module 2. The length of the portion of the second isolation structure 5 extending to the side face of the display module 2 may be approximately same as a thickness of the display screen 21 in the display module 2. As shown in FIG. 8, a cross-sectional shape of the second isolation structure 5 may be roughly an L-shaped strip.

Embodiment 2 is follows.

FIGS. 9 to 12 are another schematic structural diagram of a display device provided in embodiments of the present disclosure. FIG. 13 is an upward view of the display device structure viewed from one side of the module bottom frame shown in FIGS. 9 to 12, and only part of components of the display device are shown. FIGS. 9 to 12 may be considered as a cross-sectional view of the dashed line in FIG. 13. In some embodiments, based on the structure provided in Embodiment 1, as shown in FIGS. 9 to 13, a limiting structure 111 may be arranged on a side of the module top frame 11 facing the module bottom frame 12, and the limiting structure 111 is configured to limit a position of the touch module 3. FIG. 13 only illustrates a specific implementation of a limiting structure 111, and the present disclosure does not limit the specific structure of the limiting structure 111.

Figure 9:
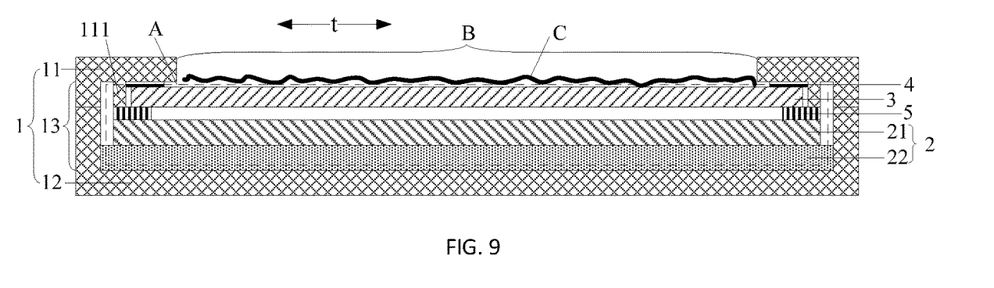
FIG. 9 is another schematic structural diagram of a display device provided in an embodiment of the present disclosure.
Figure 10:
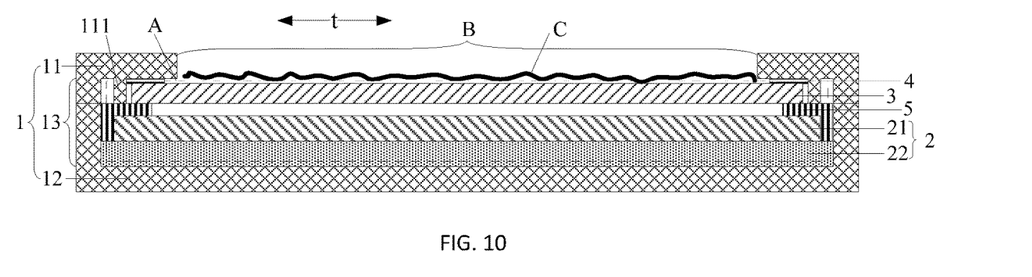
FIG. 10 is another schematic structural diagram of a display device provided in an embodiment of the present disclosure.

In some embodiments, as shown in FIGS. 9 and 10, in order to avoid high-frequency noise caused by friction between the touch module 3 and the module top frame 11 during vibration, the first isolation structure 4 may be fixed on a surface of the touch module 3 facing the module top frame 11. That is, the first isolation structure 4 is arranged in a peripheral area of the display opening window B to isolate the touch module 3 and the module top frame 11 without affecting the display. An edge of the first isolation structure 4 on a surface of the touch module 3 facing the module top frame 11 may extend beyond the touch module 3, or may be within the range of the touch module 3, which is not limited here. A shape of the first isolation structure 4 may be roughly a strip.

Figure 11:
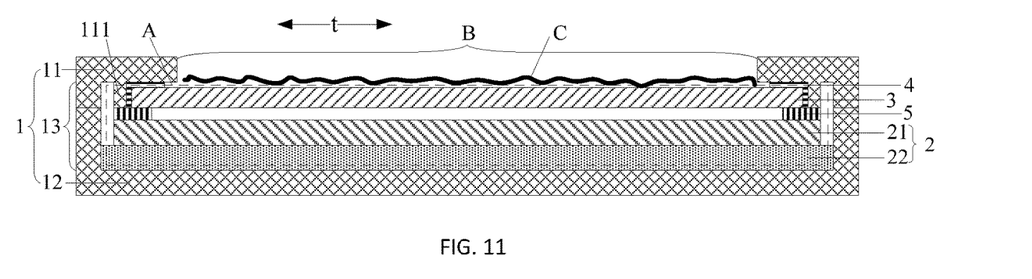
FIG. 11 is another schematic structural diagram of a display device provided in an embodiment of the present disclosure.
Figure 12:
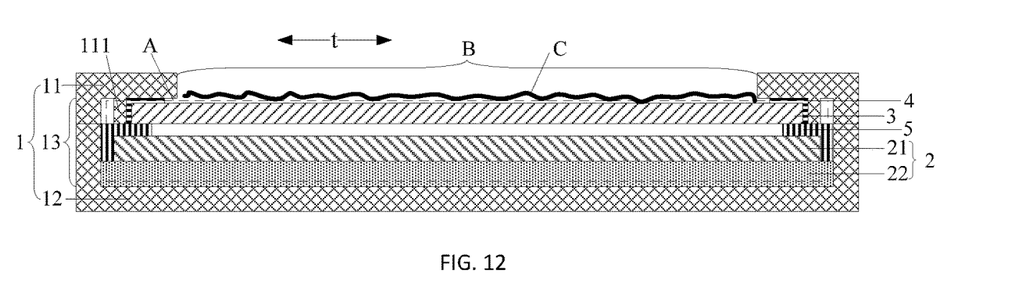
FIG. 12 is another schematic structural diagram of a display device provided in an embodiment of the present disclosure.
Figure 13:
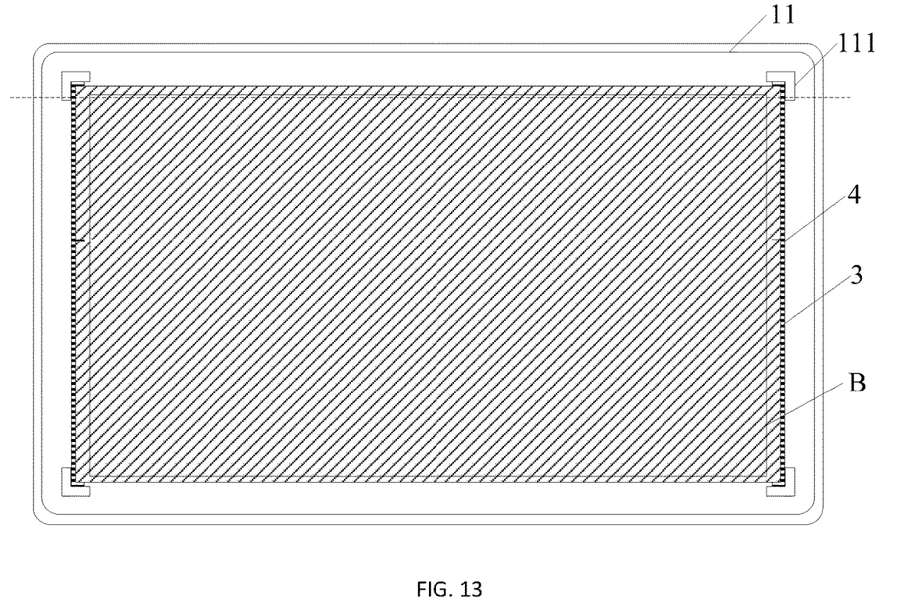
FIG. 13 is another schematic diagram of an upward view structure of a display device provided in an embodiment of the present disclosure.

In some embodiments, there is generally a certain assembly gap between the edge of touch module 3 and the limiting structure 111, in order to avoid high-frequency noise caused by friction between touch module 3 and the limiting structure 111 during vibration, as shown in FIG. 11 and FIG. 12, the first isolation structure 4 may be fixed between the touch module 3 and the limiting structure 111. That is, the first isolation structure 4 extends from a surface of the touch module 3 facing the module top frame 11 to a side face of the touch module 3 after bending. Moreover, in the present disclosure, there is no clear limit on the length of the portion of the first isolation structure 4 extending to the side face of the touch module 3. The length of the portion of the first isolation structure 4 extending to the side face of the touch module 3 may be approximately same as a thickness of the touch module 3. In some embodiments, a cross-sectional shape of the first isolation structure 4 may be roughly an L-shaped strip.

Figure 14:
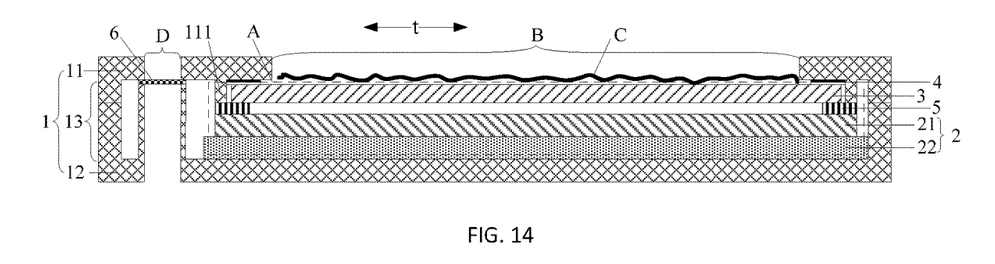
FIG. 14 is another schematic structural diagram of a display device provided in an embodiment of the present disclosure.
Figure 15:
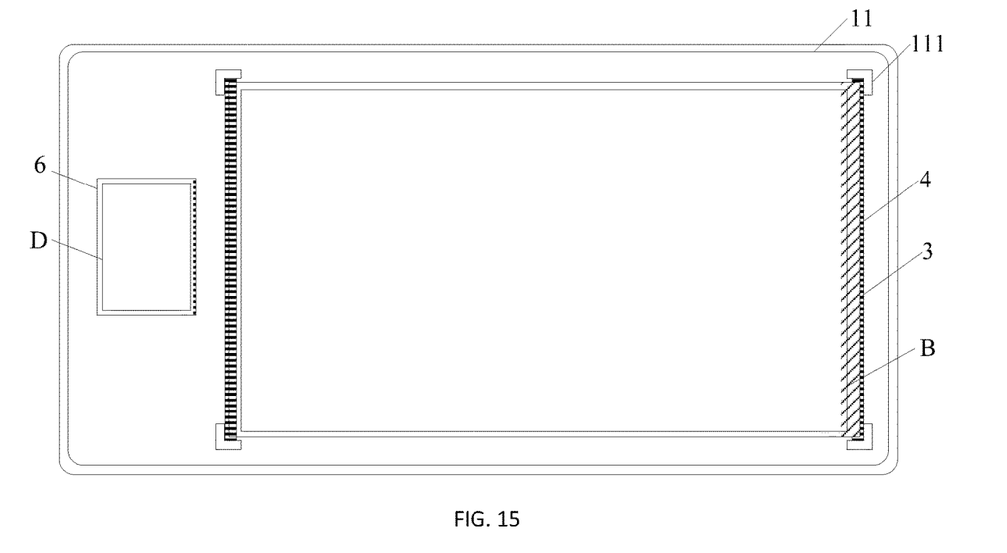
FIG. 15 is another schematic diagram of an upward view structure of a display device provided in an embodiment of the present disclosure.

FIG. 14 is another schematic structural diagram of a display device provided in embodiments of the present disclosure. FIG. 15 is an upward view of the display device structure viewed from one side of the module bottom frame shown in FIG. 14, and only part of components of the display device are shown. In some embodiments, in the module outer frame 1, a display sample 6 may be arranged according to client requirements. In this case, as shown in FIG. 14 and FIG. 15, a corresponding display opening window D may be arranged in the module top frame 11, a the size of the display opening window D should be smaller than a size of the display sample 6. Positions of display opening window D and display opening window B at the module top frame 11 may be arranged according to client requirements, and will not be elaborated here.

The structure of the second isolation structure 5 in Embodiment 2 is the same as the structure of the second isolation structure 5 in Embodiment 1, and will not be elaborated here. Embodiment 3 is as follows.

Figure 16:
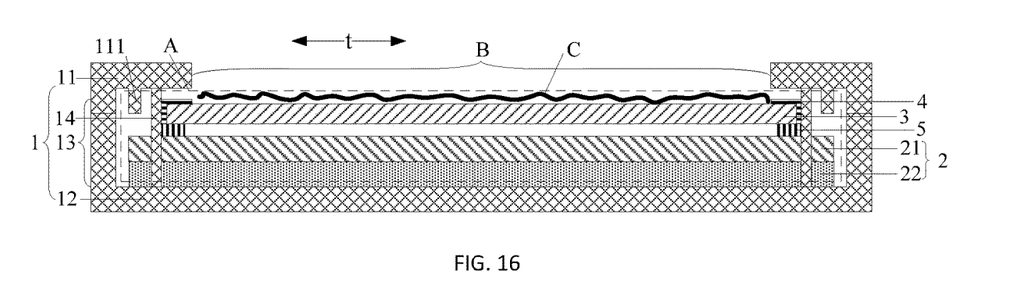
FIG. 16 is another schematic structural diagram of a display device provided in an embodiment of the present disclosure.

FIG. 16 is another schematic structural diagram of a display device provided in embodiments of the present disclosure. In some embodiments, on the basis of the structure provided in Embodiment 1 or Embodiment 2, in order to increase firmness of fixing the display module 2 and the touch module 3, the module outer frame 1 may further include a fixing component 14 located in the accommodation space A, and the fixing component 14 is configured to fix the display module 2 and the touch module 3. One end of the fixing component 14 may be fixed with the module top frame 11, and the other end of the fixing component 14 may be fixed with the module bottom frame 12. The specific structure of the fixing component 14 is not limited in the present disclosure.

In some embodiments, as shown in FIG. 16, in order to avoid high-frequency noise caused by friction between the fixing component 14 and the touch module 3 during vibration, the first isolation structure 4 may be arranged between the fixing component 14 and the touch module 3. Moreover, the first isolation structure 4 is arranged in ta peripheral area of the display opening window B to isolate the touch module 3, the fixing component 14 and the module top frame 11 without affecting the display.

The structure of the second isolation structure 5 in Embodiment 3 is the same as the structure of the second isolation structure 5 in Embodiment 1, and will not be elaborated here.

Embodiment 4 is as follows.

Figure 17:
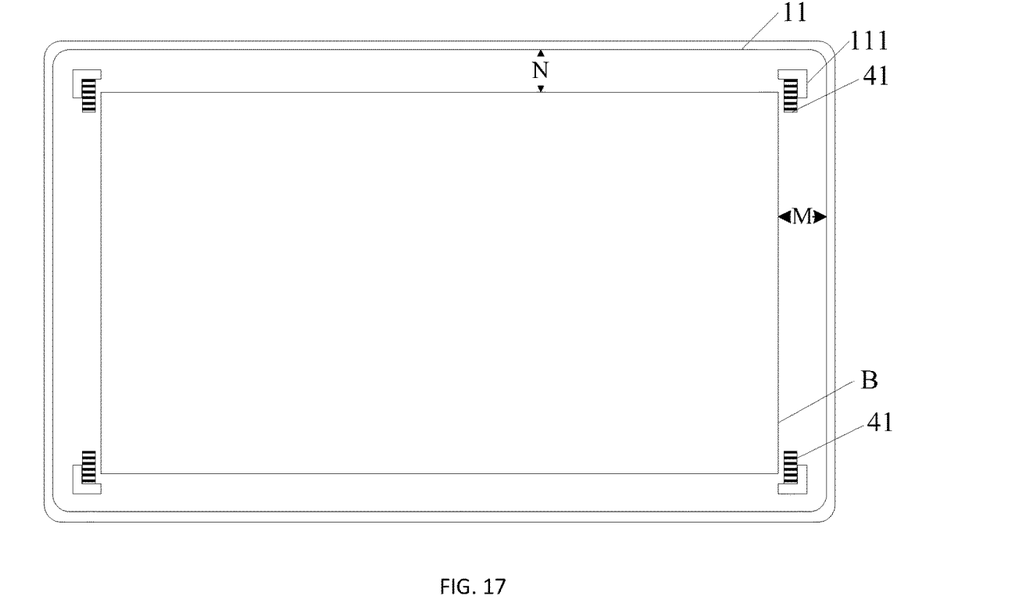
FIG. 17 is another schematic diagram of an upward view structure of a display device provided in an embodiment of the present disclosure.

FIG. 17 is an upward view of a display device viewed from one side of the module bottom frame provided in an embodiment, only illustrating the module top frame 11 and the first isolation structure 4. In some embodiments, based on the structure provided in Embodiment 1, Embodiment 2 or Embodiment 3, as shown in FIG. 17, the shape of the first isolation structure 4 is a discontinuous pattern. That is, the first isolation structure 4 located on one edge frame includes a plurality of first isolation parts 41 arranged at intervals. In FIG. 17, only one pattern of the first isolation unit 41 is illustrated. The structure of the first isolation part 41 is the same as the first isolation structure in Embodiment 1, Embodiment 2 or Embodiment 3, and will not be elaborated here.

In some embodiments, based on the structure provided in Embodiment 1, Embodiment 2 or Embodiment 3, the shape of the second isolation structure 5 is a discontinuous pattern. That is, the second isolation structure 5 located on one edge frame includes a plurality of second isolation parts arranged at intervals. The structure of the second isolation part is the same as the second isolation structure in Embodiment 1, Embodiment 2 or Embodiment 3, and will not be elaborated here.

Embodiment 5 is as follows.

Figure 18:
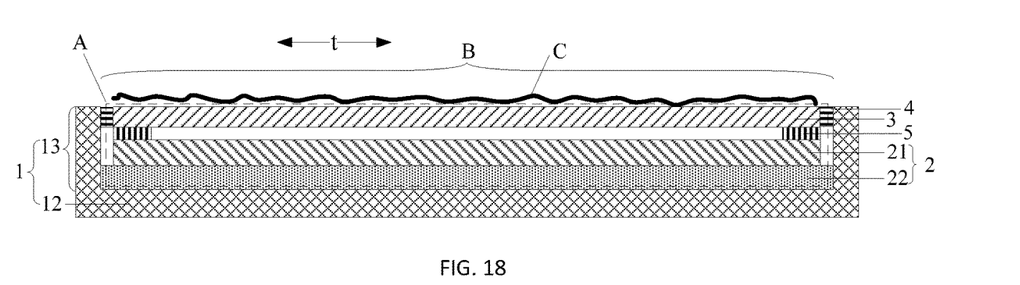
FIG. 18 is another schematic structural diagram of a display device provided in an embodiment of the present disclosure.
Figure 19:
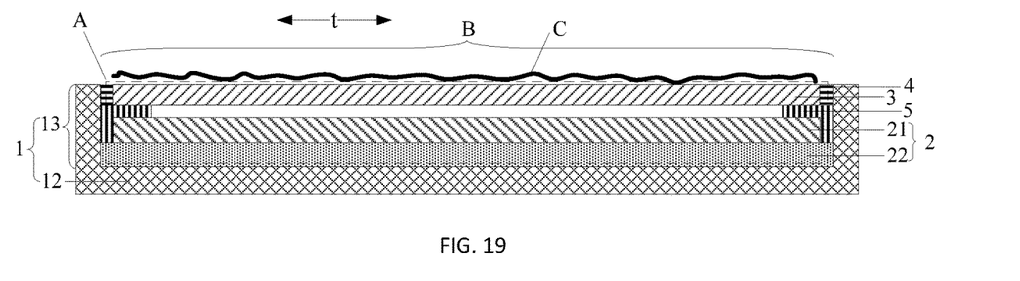
FIG. 19 is another schematic structural diagram of a display device provided in an embodiment of the present disclosure.

FIGS. 18 and 19 are other schematic structural diagrams of a display device provided in embodiments of the present disclosure. In some embodiments, as shown in FIGS. 18 and 19, in order to achieve full screen display, the module outer frame 1 can include the module side frame 13 and the module bottom frame 12. That is, the module outer frame 1 is not provided with a module top cover, and the display opening window B is arranged at a side away from the module bottom frame 12. An accommodating space A is formed by the module bottom frame 12 and the module side frame 13. The display module 2, the touch module 3, the first isolation structure 4, and the second isolation structure 5 are all arranged in the accommodating space A. In some embodiments, the module side frame 13 can form an integral structure with the module bottom frame 12. When assembling the display device, a complete display device may be formed by sequentially assembling the display module 2, the second isolation structure 5, the touch module 3, and the first isolation structure 4 on the module bottom frame 12.

In some embodiments, as shown in FIGS. 18 and 19, in order to avoid high-frequency noise caused by friction between the module side frame 13 and the touch module 3 during vibration, the first isolation structure 4 may be arranged between the module side frame 13 and the touch module 3. Moreover, in order to fix the position of the touch module 3, the first isolation structure 4 needs to be arranged around the touch module 3, that is, the first isolation structure 4 is arranged at four edge frames of the touch module 3. Moreover, as shown in FIGS. 18 and 19, the top of module side frame 13 may be flush with the first isolation structure 4 and the touch module 3.

In some embodiments, due to that the haptic sensor 31 is opaque, in order to avoid impact of the haptic sensor 31 on display, as shown in FIGS. 3C and 3D, when both the haptic sensor 31 and the second isolation structure 5 are located at opposite short edge frames, the touch module 3 can include a light-blocking layer 37 that blocks the haptic sensor 31 and the second isolation structure 5. The middle area of the light-blocking layer 37 is a transparent area, and the distance a between a light-blocking area in the light-blocking layer 37 and the edge of the short edge frame is greater than or equal to the sum of L1, L2 and L3. The distance b between the light-blocking area in the shading layer 37 and the edge of the long edge frame is greater than or equal to 0.

The structure of the second isolation structure 5 in Embodiment 5 is the same as the structure of the second isolation structure 5 in Embodiment 1, Embodiment 2, Embodiment 3 or Embodiment 4, and will not be elaborated here.

The above introduces the display device provided in the present disclosure through five embodiments, and the structures between the embodiments may be combined with each other.

In the display device provided by embodiments of the present disclosure, in order to avoid high-frequency noise caused by friction between display module 2 and module outer frame 1 when the touch module 3 vibrates, the first isolation structure 4 is used to isolate the touch module 3 and module outer frame 1, maintain a certain distance between the touch module 3 and the module outer frame 1; and the second isolation structure 5 is used to isolate the display module 2 and the touch module 3, maintain a certain distance between the display module 2 and the touch module 3, avoiding high-frequency noise and heat generated by friction between the touch module 3 and the display module 2 and friction between the touch module 3 and the module outer frame 1, which affects the user experience. Moreover, the first isolation structure 4 and the second isolation structure 5 are not completely fixed to the touch module 3, so the first isolation structure 4 and the second isolation structure 5 may not significantly suppress the vibration of the touch module 3 during the operation of the haptic sensor 31. That is, the intensity of haptic perception can be effectively ensured without reducing the vibration amplitude of touch module 3.

Apparently, those skilled in the art can make various modifications and variations to embodiments of the present disclosure without departing from the spirit and scope of embodiments of the present disclosure. In this way, if the modifications and variations of embodiments of the present disclosure fall within the scope of the claims of the present disclosure and their equivalent technologies, the present disclosure is also intended to include these modifications and variations.

What is claimed is:
1. A display device, comprising:
   a module outer frame, comprising a display opening window, wherein an accommodation space is formed inside the module outer frame;
   a display module, fixed in the accommodating space, wherein a light emitting side of the display module faces the display opening window;

a touch module, fixed between the display module and the display opening window, wherein the touch module comprises a haptic sensor, and the haptic sensor is configured to generate a standing wave on a surface of the touch module during operation;

a first isolation structure, arranged between the touch module and the module outer frame, wherein the first isolation structure is configured to isolate the touch module from the module outer frame; and a second isolation structure, arranged between the display module and the touch module, wherein the second isolation structure is configured to isolate the display module from the touch module;

wherein the first isolation structure is located at positions of two opposite edge frames of the touch module; and the first isolation structure and the second isolation structure are arranged at positions of edge frames on same side.

2. The display device according to claim 1, wherein a Young's modulus of each of the first isolation structure and the second isolation structure is less than 0.1 Mpa;

wherein a material of the first isolation structure is polydimethylsiloxane, PDMS, foam or rubber; and a material of the second isolation structure is PDMS, foam or rubber.

3. The display device according to claim 1, wherein the second isolation structure is located at positions of two opposite edge frames of the display module.

4. The display device according to claim 3, wherein the second isolation structure located at one of the positions of the two opposite edge frames comprises a plurality of second isolation parts arranged at intervals.

5. The display device according to claim 3, wherein an extension direction of each of the two opposite edge frames where the second isolation structure is located is perpendicular to a vibration propagation direction of the standing wave.

6. The display device according to claim 3, wherein the two opposite edge frames where the second isolation structure is located are short edge frames.

7. The display device according to claim 3, wherein the second isolation structure is fixed on a surface of the display module facing the touch module.

8. The display device according to claim 7, wherein the module outer frame comprises a module side frame and a module bottom frame, and the display opening window is located at a side facing away from the module bottom frame; and the second isolation structure is further fixed on a side of the display module facing the module side frame.

9. The display device according to claim 1, wherein the first isolation structure located at one of the positions of the two opposite edge frames comprises a plurality of first isolation parts arranged at intervals.

10. The display device according to claim 1, wherein the module outer frame comprises a module side frame, a module bottom frame, and a module top frame, and the module top frame comprises the display opening window; and the first isolation structure is fixed on a surface of the touch module facing the module top frame.

11. The display device according to claim 10, wherein the first isolation structure and the second isolation structure are covered by the module top frame, and the first isolation structure and the second isolation structure do not overlap with the display opening window.

12. The display device according to claim 11, wherein the haptic sensor is covered by the module top frame, and the haptic sensor does not overlap with the display opening window.

13. The display device according to claim 12, wherein the haptic sensor, the first isolation structure, and the second isolation structure are located at positions of two opposite short edge frames;

a relationship between a width L2 of the haptic sensor at one short edge frame and a distance L1 between the haptic sensor and an edge of the short edge frame satisfies:

$$0 < L1 \leq L/n;$$
$$0 < L2 \leq L/n;$$

wherein n is a positive integer, and L is a length of the touch module.

14. The display device according to claim 10, wherein the first isolation structure is further fixed on a side of the touch module facing the module side frame.

15. The display device according to claim 10, further comprising: a limiting structure, arranged on a side of the module top frame facing the module bottom frame;

wherein the limiting structure is configured to limit a position of the touch module; and the first isolation structure is further fixed between the touch module and the limiting structure.

16. The display device according to claim 1, wherein the module outer frame comprises a fixing component within the accommodating space, the fixing component is configured to fix the display module and the touch module; and the first isolation structure is arranged between the fixing component and the touch module.

17. The display device according to claim 1, wherein the module outer frame comprises a module side frame and a module bottom frame, and the display opening window is located at a side facing away from the module bottom frame; and the first isolation structure is arranged between the touch module and the module side frame.

18. The display device according to claim 17, wherein the first isolation structure is arranged to surround the touch module.

19. The display device according to claim 17, wherein the haptic sensor and the second isolation structure are located at positions of two opposite short edge frames; and the touch module comprises a light-blocking layer configured to block the haptic sensor and the second isolation structure.

* * * * *